(12) United States Patent
Peng

(10) Patent No.: US 11,374,204 B2
(45) Date of Patent: Jun. 28, 2022

(54) ORGANIC LIGHT EMITTING DIODE DISPLAY PANEL AND ELECTRONIC DEVICE

(71) Applicant: Wuhan China Star Optoelectronics Semiconductor Display Technology Co., Ltd., Hubei (CN)

(72) Inventor: Simin Peng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 363 days.

(21) Appl. No.: 16/625,515

(22) PCT Filed: Oct. 11, 2019

(86) PCT No.: PCT/CN2019/110606
§ 371 (c)(1),
(2) Date: Dec. 20, 2019

(87) PCT Pub. No.: WO2020/244110
PCT Pub. Date: Dec. 10, 2020

(65) Prior Publication Data
US 2021/0408491 A1    Dec. 30, 2021

(30) Foreign Application Priority Data

Jun. 6, 2019    (CN) .......................... 201910489369.6

(51) Int. Cl.
*H01L 33/00* (2010.01)
*H01L 21/00* (2006.01)
(Continued)

(52) U.S. Cl.
CPC ...... *H01L 51/5275* (2013.01); *H01L 27/3227* (2013.01); *H01L 51/5271* (2013.01); *H01L 2251/5369* (2013.01)

(58) Field of Classification Search
CPC ............ H01L 51/5271; H01L 51/5275; H01L 27/3227
(Continued)

(56) References Cited

U.S. PATENT DOCUMENTS 8,872,207 B2* 10/2014 Jeong .................. H01L 51/5275
257/40
9,262,001 B2* 2/2016 Lee ...................... H01L 27/3244
(Continued)

FOREIGN PATENT DOCUMENTS

CN      1630090 A      6/2005
CN    101241923 A      8/2008
(Continued)

*Primary Examiner* — Calvin Lee
(74) *Attorney, Agent, or Firm* — Luedeka Neely Group, P.C.

(57) ABSTRACT

An organic light emitting diode display panel and an electronic device is provided. Light being incident with a specific angle to an interface between a filling portion and at least one film layer causes total reflection to reduce light being incident into the film layer surrounding the inner wall of the through hole, such that an amount of light after the total reflection reached the substrate and passed through the substrate and received by the optical sensor is increased.

20 Claims, 2 Drawing Sheets

(51) Int. Cl.
*H01L 51/52* (2006.01)
*H01L 27/32* (2006.01)

(58) Field of Classification Search
USPC .................................. 438/29–31, 69; 257/98
See application file for complete search history.

(56) References Cited

U.S. PATENT DOCUMENTS

| | | |
|---|---|---|
| 10,847,589 B2 * | 11/2020 | Xiang ................. H01L 27/3246 |
| 2006/0014314 A1 | 1/2006 | Yaung et al. |
| 2008/0191296 A1 | 8/2008 | Wang et al. |
| 2009/0026924 A1 | 1/2009 | Leung et al. |
| 2009/0278967 A1 | 11/2009 | Toumiya |
| 2019/0123115 A1 | 4/2019 | Sun et al. |
| 2020/0185466 A1 | 6/2020 | Xiang |
| 2020/0211480 A1 | 7/2020 | Xiang et al. |

FOREIGN PATENT DOCUMENTS

| | | | | |
|---|---|---|---|---|
| CN | 101577288 A | | 11/2009 | |
| CN | 102751447 A | | 10/2012 | |
| CN | 104425542 | * | 8/2013 | ........... G06F 3/0412 |
| CN | 104037357 A | | 9/2014 | |
| CN | 104393016 A | | 3/2015 | |
| CN | 106486519 A | | 3/2017 | |
| CN | 107451576 A | | 12/2017 | |
| CN | 107658332 A | | 2/2018 | |
| CN | 108039356 A | | 5/2018 | |
| CN | 108258008 A | | 7/2018 | |
| CN | 108717244 A | | 10/2018 | |
| CN | 109119446 A | | 1/2019 | |
| CN | 109148525 A | | 1/2019 | |
| CN | 109768188 A | | 5/2019 | |
| CN | 110265439 A | | 9/2019 | |

* cited by examiner

ORGANIC LIGHT EMITTING DIODE DISPLAY PANEL AND ELECTRONIC DEVICE

FIELD OF INVENTION

The present application relates to a field of display technologies, and in particular to organic light emitting diode display panels and electronic devices.

BACKGROUND OF INVENTION

Organic light emitting diodes (OLEDs) are made of organic materials that emit light when current passes through. OLEDs have advantages such as self-illumination, wide viewing angles, high contrast, low power consumption, fast response times, and the ability to be made into large size and flexible panels, OLEDs have become popular research.

In recent years, OLEDs have been widely used in display panels of mobile phones (small size displays), and a camera under panel (CUP) is a new type of OLED display device. The OLED display device places a camera under an OLED display panel while a display area of the OLED display panel can normally display. In order to ensure that an area of the OLED display panel corresponding to the under-panel camera has light permeability to increase transmittance, realization is done by creating a hole in a region of the OLED display panel corresponding to the camera to form a light transmitting region. However, part of light being incident into the hole is absorbed by a film layer on an inner wall of the hole results that an amount of light reaching the camera is reduced.

TECHNICAL PROBLEM: An object of the present application is to provide an organic light emitting diode display panel and an electronic device to reduce light being incident into a film layer surrounding a through hole in an organic light emitting diode display panel, and to increase an amount of light received by the optical sensor in the electronic device.

SUMMARY OF INVENTION

An organic light emitting diode display panel, the organic light emitting diode display panel including:

a substrate having a first surface and a second surface opposite to each other;

a thin film transistor array layer formed on the first surface of the substrate;

an organic light emitting diode array layer formed on a side of the thin film transistor array layer away from the substrate;

an encapsulation layer formed on a side of the organic light emitting diode array layer away from the substrate;

a through hole passing through the thin film transistor array layer, the organic light emitting diode array layer, and the encapsulation layer in a direction from the substrate to the encapsulation layer;

a filling portion filled in the entire through hole;

wherein a refractive index of the filling portion is greater than a refractive index of at least one film layer in the thin film transistor array layer, and/or the refractive index of the filling portion is greater than a refractive index of at least one film layer in the organic light emitting diode array layer, and/or the refractive index of the filling portion is greater than a refractive index of at least one film layer in the encapsulation layer.

In the above organic light emitting diode display panel, the refractive index of the filling portion is greater than a maximum refractive index of each film layer in the organic light emitting diode array layer, in the thin film transistor array layer, and in the encapsulation layer.

In the above organic light emitting diode display panel, the filling portion includes a first filling portion filled in the through hole, and a second filling portion filled between an outer wall of the first filling portion and an inner wall of the through hole, a refractive index of the first filling portion is greater than a refractive index of the second filling portion;

the refractive index of the second filling portion is greater than the refractive index of the at least one film layer in the thin film transistor array layer, and/or the refractive index of the second filling portion is greater than the refractive index of the at least one film layer in the organic light emitting diode array layer, and/or the refractive index of the second filling portion is greater than the refractive index of the at least one film layer in the encapsulation layer.

In the above organic light emitting diode display panel, the refractive index of the second filling portion is greater than the maximum refractive index of each film layer in the organic light emitting diode array layer, in the thin film transistor array layer, and in the encapsulation layer.

In the above organic light emitting diode display panel, the refractive index of the filling portion ranges from a value being greater than 1.9 to a value being less than or equal to 5.0.

In the above organic light emitting diode display panel, a preparation material of the filling portion includes organic silicon and a plurality of nanoparticles.

In the above organic light emitting diode display panel, a preparation material of the nanoparticles is selected from a group consisting of at least one of $Y_2O_3$, $CeO_2$, $MgO$, $ZnS$, $TiO_2$, $ThF_4$, and $ZrO_2$.

In the above organic light emitting diode display panel, the preparation material of the filling portion is selected from a group consisting of at least one of $Y_2O_3$, $CeO_2$, $TiO_2$, $Al_2O_3$, $ZnS$, $ZrO_2$, $MgO$, and $ThF_4$.

In the above organic light emitting diode display panel, the refractive index of the filling portion ranges from 2 to 2.5.

In the above organic light emitting diode display panel, a longitudinal cross-section of the through hole is an inverted trapezoid.

An electronic device, the electronic device including an organic light emitting diode display panel and an optical sensor, the organic light emitting diode display panel including:

a substrate having a first surface and a second surface opposed to each other;

a thin film transistor array layer formed on the first surface of the substrate;

an organic light emitting diode array layer formed on a side of the thin film transistor array layer away from the substrate;

an encapsulation layer formed on a side of the organic light emitting diode array layer away from the substrate;

a through hole passing through the thin film transistor array layer, the organic light emitting diode array layer, and the encapsulation layer in a direction which the substrate is directed to the encapsulation layer;

a filling portion filled in the entire through hole;

the optical sensor disposed on a side of the second surface of the substrate and corresponding to the through hole;

wherein a refractive index of the filling portion is greater than a refractive index of at least one film layer in the thin film transistor array layer, and/or the refractive index of the filling portion is greater than a refractive index of at least one film layer in the organic light emitting diode array layer, and/or the refractive index of the filling portion is greater than a refractive index of at least one film layer in the encapsulation layer.

In the above electronic device, the refractive index of the filling portion is greater than a maximum refractive index of each film layer in the organic light emitting diode array layer, the in thin film transistor array layer, and in the encapsulation layer.

In the above electronic device, the filling portion includes a first filling portion filled in the through hole, and a second filling portion filled between an outer wall of the first filling portion and an inner wall of the through hole, a refractive index of the first filling portion is greater than a refractive index of the second filling portion;

the refractive index of the second filling portion is greater than the refractive index of the at least one film layer in the thin film transistor array layer, and/or the refractive index of the second filling portion is greater than the refractive index of the at least one film layer in the organic light emitting diode array layer, and/or the refractive index of the second filling portion is greater than the refractive index of the at least one film layer in the encapsulation layer.

In the above electronic device, the refractive index of the second filling portion is greater than the maximum refractive index of each film layer in the organic light emitting diode array layer, in the thin film transistor array layer, and in the encapsulation layer.

In the above electronic device, the refractive index of the filling portion ranges from a value being greater than 1.9 to a value being less than or equal to 5.0.

In the above electronic device, a preparation material of the filling portion includes organic silicon and a plurality of nanoparticles.

In the above electronic device, a preparation material of the nanoparticles is selected from a group consisting of at least one of $Y_2O_3$, $CeO_2$, $TiO_2$, $Al_2O_3$, ZnS, $ZrO_2$, MgO, and $ThF_4$.

In the above electronic device, the preparation material of the filling portion is selected from a group consisting of at least one of $Y_2O_3$, $CeO_2$, $TiO_2$, $Al_2O_3$, ZnS, $ZrO_2$, MgO, and $ThF_4$.

In the above electronic device, the refractive index of the filling portion ranges from 2 to 2.5.

In the above electronic device, a longitudinal cross-section of the through hole is an inverted trapezoid.

BENEFICIAL EFFECT: The present application provides an organic light emitting diode display panel and an electronic device. Light being incident with a specific angle to an interface between a filling portion and at least one film layer causes total reflection to reduce light being incident into the film layer surrounding the inner wall of the through hole, such that an amount of light after the total reflection reached the substrate and passed through the substrate and received by the optical sensor is increased.

DRAWINGS

Figure 1:
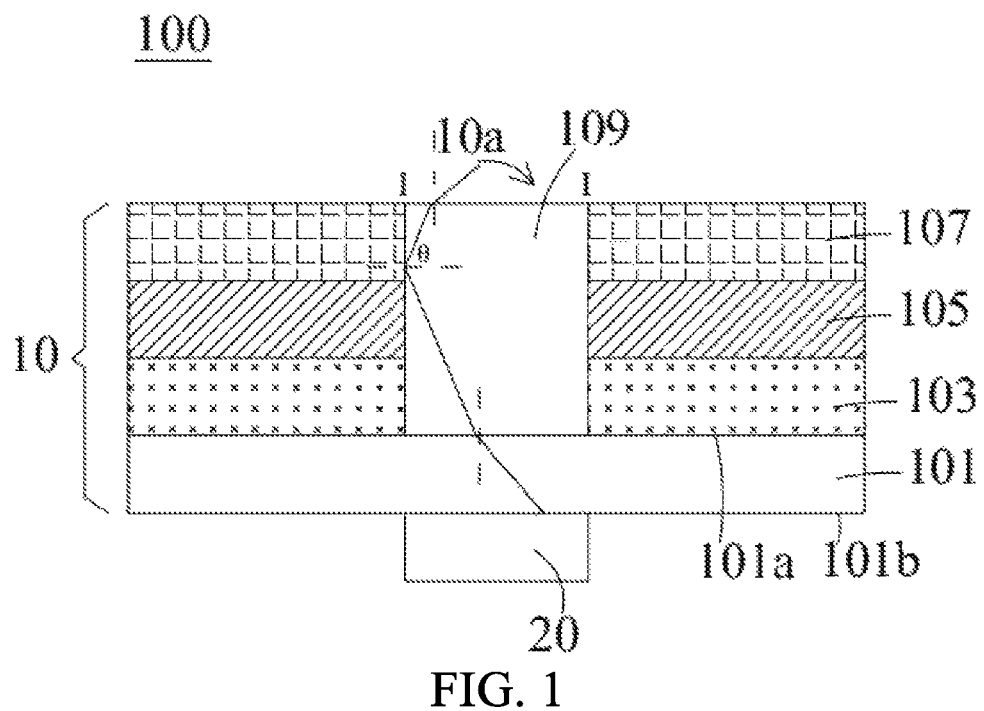
FIG. 1 is a schematic structural view of an electronic device according to a first embodiment of the present application.

REFERENCE NUMERAL 100 electronic device; 10 organic light emitting diode display panels; 20 optical sensor;

101 substrate; 103 thin film transistor array layer; 105 organic light emitting diode array layer;

107 encapsulation layer; 10a through hole; 109 filling portion; 101a first surface; 101b second surface; 1091 first filling portion; 1092 second filling portion.

DETAILED DESCRIPTION OF EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Please refer to FIG. 1, which is a schematic structural view of an electronic device according to a first embodiment of the present application. An electronic device 100 includes an organic light emitting diode display panel 10 and an optical sensor 20.

The organic light emitting diode display panel 10 includes a substrate 101, a thin film transistor array layer 103, an organic light emitting diode array layer 105, an encapsulation layer 107, a through hole 10a, and a filling portion 109.

The substrate 101 has a first surface 101a and a second surface 101b opposite to each other. The substrate 101 may be a glass substrate or a flexible polymer substrate. The flexible polymer substrate includes, but are not limited to, a polyimide substrate.

The thin film transistor array layer 103 is formed on the first surface 101a of the substrate 101. The thin film transistor array layer 103 includes a plurality of thin film transistors disposed on the first surface 101a of the substrate 101 in array, and the thin film transistors are configured to control an operating state of organic light emitting diodes. The thin film transistors may be polysilicon thin film transistors or metal oxide thin film transistors. Each of the thin film transistors includes a gate electrode, an active layer, a source/drain electrode, a gate insulating layer formed between the gate electrode and the active layer, an interlayer insulating layer formed between the source/drain electrode and the active layer, etc. The thin film transistor array layer 103 may further include a passivation layer to prevent impurity ions from entering the thin film transistors. The thin film transistor array layer 103 may further include a planarization layer to make a surface of the thin film transistor array layer 103 more flat. Predictably, the thin film transistor array layer 103 includes a plurality of film layers, and different film layers have different refractive indexes. In general, a metal layer in the thin film transistor array layer 103 reflects light, and an organic layer and an inorganic layer constituting the thin film transistor array layer 103 have a refractive index being less than or close to 1.9, so a maximum refractive index of each film layer in the thin film transistor array layer 103 is less than or close to 1.9.

The organic light emitting diode array layer 105 is formed on a side of the thin film transistor array layer 103 away from the substrate 101. The organic light emitting diode array layer 105 includes a plurality of organic light emitting diodes arranged in array, the organic light emitting diodes emit visible light to display an image. Each of the organic light emitting diodes includes an anode, a cathode, and an organic light emitting layer formed between the anode and the cathode. The organic light emitting diode may further include a hole injection layer, a hole transport layer, an electron block layer, an electron injection layer, an electron transport layer, a hole block layer, etc. Predictably, the organic light emitting diode array layer 105 includes different film layers, and the different film layers have different refractive indexes. A refractive index of each film layer constituting the organic light emitting diode array layer 105 is generally less than 1.9.

The encapsulation layer 107 is formed on a side of the organic light emitting diode array layer 105 away from the substrate 101. The encapsulation layer 107 is used to encapsulate the organic light emitting diode array layer 105 to avoid corrosion of an active metal and an organic light emitting material in the organic light emitting diode array layer 105, resulting in a shortened service life of the organic light emitting diodes. The encapsulation layer 107 includes a first inorganic layer, a second inorganic layer, and an organic layer located between the first inorganic layer and the second inorganic layer. By utilizing the inorganic layer has good barrier property and the organic layer has good flexibility property, the encapsulation layer 107 functions to block moisture and oxygen. Predictably, the encapsulation layer 107 includes a plurality of film layers, and different film layers have different refractive indexes for light. In general, the refractive index of each film layer in the encapsulation layer 107 is less than or close to 1.9.

The through hole 10a penetrates the thin film transistor array layer 103, the organic light emitting diode array layer 105, and the encapsulation layer 107 in a direction which the substrate 101 is directed to the encapsulation layer 107. A longitudinal cross-section of the through hole 10a is a rectangle. The through hole 10a is a cylindrical hole.

The filling portion 109 is filled in the entire through hole 10a. A refractive index of the filling portion 109 is greater than a refractive index of at least one film layer in the thin film transistor array layer 103, and/or the refractive index of the filling portion 109 is greater than a refractive index of at least one film layer in the organic light emitting diode array layer 105, and/or the refractive index of the filling portion 109 is greater than a refractive index of at least one film layer in the encapsulation layer 107.

By making the refractive index of the at least one film layer in the thin film transistor array layer 103 and/or the at least one film layer in the organic light emitting diode array layer 105 and/or the at least one film layer in the encapsulation layer 107 being less than the refractive index of the filling portion 109, so that an incident light at an interface I with an incident angle greater than or equal to θ is totally reflected at at least one film layer at the interface I, an amount of light being incident into the film layer surrounding an inner wall of the through hole 10a is reduced, more light reaches the substrate 101 and passes through the substrate 101, and then is received by the optical sensor 20. The value of θ is arcsin(n2/n1), where n1 is the refractive index of the filling portion, n2 is a refractive index of each film layer in the thin film transistor array layer 103, in the organic light emitting diode array layer 105, and in the encapsulation layer 107 being a value lower than the value of n1.

Furthermore, the refractive index of the filling portion 109 is greater than the maximum refractive index of each film layer in the thin film transistor array layer 103, and/or the refractive index of the filling portion 109 is greater than the maximum refractive index of each film layer in the organic light emitting diode array layer 105, and/or the refractive index of the filling portion 109 is greater than the maximum refractive index of each film layer in the encapsulation layer 107. For example, the refractive index of the filling portion 109 is greater than the maximum refractive index of each film layer in the organic light emitting diode array layer 105, in the thin film transistor array layer 103, and in the encapsulation layer 107, so that incident light being incident into the through hole 10a and being incident into the filling portion 109 and at the interface I between each film layer surrounding the inner wall of the through hole 10a with an incident angle equal to or more than θ can be totally reflected at the interface I, and reaches the substrate 101 after one or more total reflections, passes through the substrate 101 and being incident on the optical sensor 20.

The refractive index of the filling portion 109 ranges from a value being greater than 1.9 to a value being less than or equal to 5.0. Furthermore, the refractive index of the filling portion 109 ranges from a value being greater than or equal to 2.0 to a value being less than or equal to 3.0. The refractive index of the filling portion 109 is greater than 1.9 such that more light is totally reflected at the interface I, and the refractive index of the filling portion 109 is less than or equal to 5 so as to prevent the difference in refractive index between the filling portion 109 and the substrate 101 from being excessively large, resulting in a decrease in the amount of light being incident on the optical sensor 20.

A preparation material of the filling portion 109 includes organic silicon and a plurality of nanoparticles. A preparation material of the nanoparticles is selected from a group consisting of at least one of $Y_2O_3$, $CeO_2$, $TiO_2$, $Al_2O_3$, ZnS, $ZrO_2$, MgO, and $ThF_4$. Furthermore, the preparation material of the nanoparticles is selected from at least one of $TiO_2$ (a refractive index is about 2.35), ZnS (a refractive index is about 2.4), $ZrO_2$ (a refractive index is about 2.05), and $CeO_2$ (a refractive index is about 2.20). That is, a refractive index of the preparation material of the nanoparticles ranges from 2 to 2.5, to further increase the refractive index of the filling portion 109.

The preparation material of the filling portion is selected from a group consisting of at least one of $Y_2O_3$, $CeO_2$, $TiO_2$, $Al_2O_3$, ZnS, $ZrO_2$, MgO, and $ThF_4$. Furthermore, the preparation material of the filling portion is selected from at least one of $TiO_2$ (a refractive index is about 2.35), ZnS (a refractive index is about 2.4), $ZrO_2$ (a refractive index is about 2.05), and $CeO_2$ (a refractive index is about 2.20). That is, the refractive index of the preparation material of the filling portion 109 ranges from 2 to 2.5, to further increase the refractive index of the filling portion 109.

The optical sensor 20 may be a camera, and may be other components that be able to convert optical signals into electrical signals. The optical sensor 20 is disposed on the side of the second surface 101b of the substrate 101 and is disposed corresponding to the through hole 10a. Light that has undergone one or more total reflections at interface I passes through the substrate 101 to the optical sensor 20 such that the optical signal received by optical sensor 20 is increased.

Figure 2:
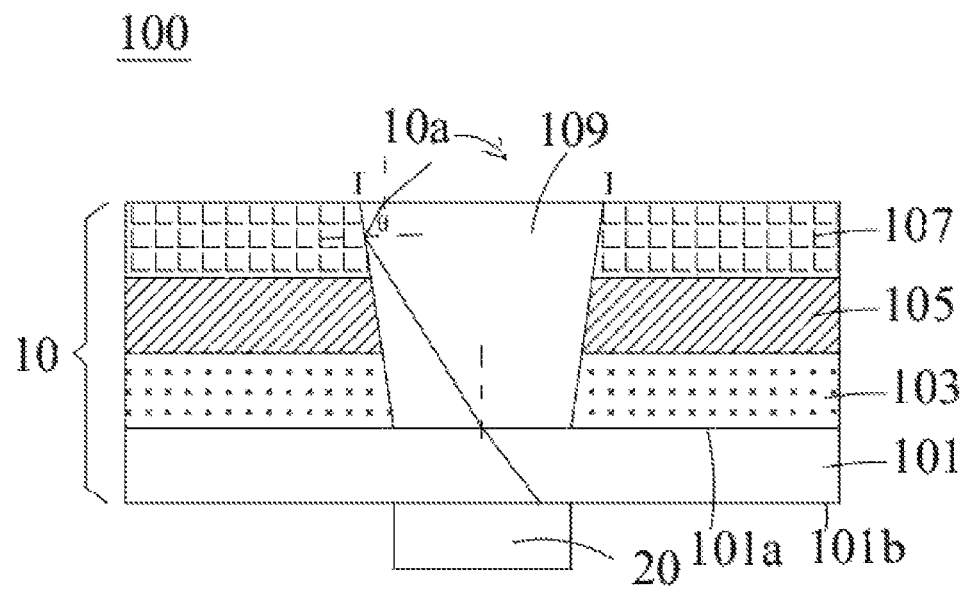
FIG. 2 is a schematic structural view of an electronic device according to a second embodiment of the present application.

Please refer to FIG. 2, which is a schematic structural view of an electronic device according to a second embodiment of the present application. The second embodiment electronic device 100 is substantially similar to the first embodiment electronic device 100 except that a longitudinal section of the through hole 10a is an inverted trapezoid, such that the amount of light being incident into the filling portion 109 is more, more light can be incident on the optical sensor 20 after being totally reflected.

Figure 3:
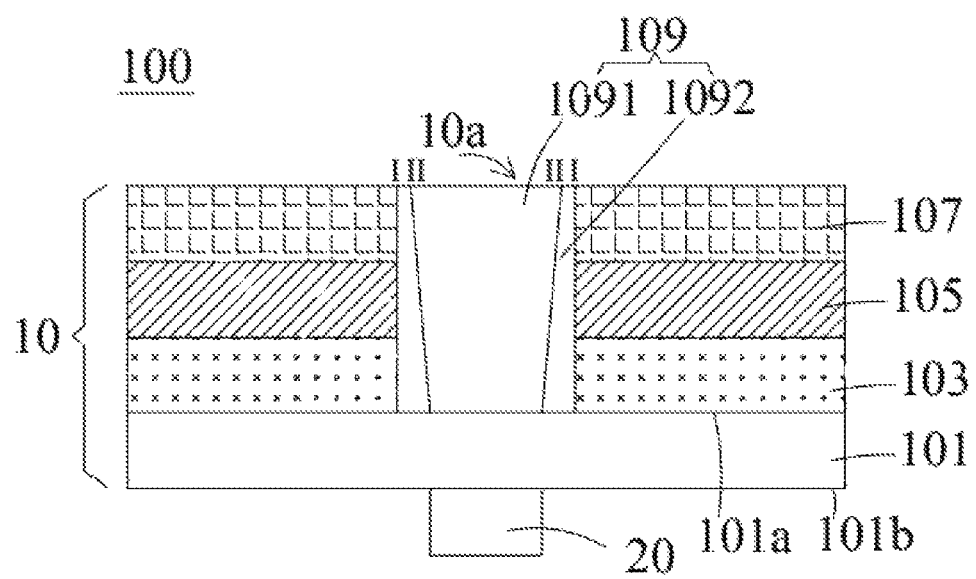
FIG. 3 is a schematic structural view of an electronic device according to a third embodiment of the present application.

Please refer to FIG. 3, which is a schematic structural view of an electronic device according to a third embodiment of the present application. The third embodiment electronic device 100 is substantially similar to the second embodiment electronic device 100 except that the filling portion 109 includes a first filling portion 1091 filled in the through hole 10a and a second filling portion 1092 filled between an outer wall of the first filling portion 1091 and the inner wall of the through hole 10a, a refractive index of the first filling portion 1091 is greater than a refractive index of the second filling portion 1092. The refractive index of the second filling portion 1092 is greater than the refractive index of the at least one film layer in the thin film transistor array layer 103, and/or the refractive index of the second filling portion 1092 is greater than the refractive index of the at least one film layer in the organic light emitting diode array layer 105, and/or the refractive index of the second filling portion 1092 is greater than the refractive index of the at least one film layer in the encapsulation layer 107. Specifically, the refractive index of the second filling portion 1092 is greater than a maximum refractive index of each film layer in the organic light emitting diode array layer 105, in the thin film transistor array layer 103, and in the encapsulation layer 107.

The incident light with an incident angle being greater than or equal to $\theta$ can be totally reflected at an interface I, the interface I is an interface between the second filling portion 1092 and each film layer surrounding the inner wall of the through hole 10a. The value of the incident angle $\theta$ is arcsin (n2/n1), where n1 is the refractive index of the second filling portion 1092, and n2 is a refractive index of each film layer in the thin film transistor array layer 103, in the organic light emitting diode array layer 105, and in the encapsulation layer 107 being a value lower than the value of n1. Part of the light totally reflected at the interface I is incident into the second filling portion 1091, and total reflected at the interface II, so that is incident into the substrate 101, and passes through the substrate 101 to reach the optical sensor 20. Incident light having an incident angle greater than or equal to $\theta1$ can be totally reflected at the interface II, and the value of the incident angle $\theta1$ is arcsin(n1/n3), where n3 is the refractive index of the first filling portion 1091. Part of light that is incident with a specific incident angle is totally reflected at the interface I and at the interface II, and the optical signal is increased by one or more total reflections to the substrate 101 and passing through the substrate 101 to the optical sensor 20, thereby increasing the imaging effect of the camera.

A longitudinal cross section of the through hole 10a is a rectangle, and a longitudinal section of the first filling portion 1091 is an inverted trapezoid such that an amount of light being incident into the first filling portion 1091 is more, and more light is totally reflected at the interface II, an amount of light being incident to the optical sensor 20 is further increased, and when the optical sensor 20 is a camera, the imaging effect of the camera is improved.

The electronic device according to the embodiments of the present application, light being incident with a specific angle to an interface between a filling portion and at least one film layer causes total reflection to reduce light being incident into the film layer surrounding the inner wall of the through hole, such that an amount of light after the total reflection reached the substrate and passed through the substrate and received by the optical sensor is increased.

The description of the above embodiments is only for helping to understand the technical solutions of the present application and the core ideas thereof; those of ordinary skilled in the art should understand that they can still modify the technical solutions described in the foregoing embodiments, or some of the technologies. The features are equivalently substituted; and the modifications or substitutions do not detract from the essence of the technical solutions of the embodiments of the present application.

The invention claimed is:

1. An organic light emitting diode display panel, comprising:
    a substrate having a first surface and a second surface opposite to each other;
    a thin film transistor array layer formed on the first surface of the substrate;
    an organic light emitting diode array layer formed on a side of the thin film transistor array layer away from the substrate;
    an encapsulation layer formed on a side of the organic light emitting diode array layer away from the substrate;
    a through hole passing through the thin film transistor array layer, the organic light emitting diode array layer, and the encapsulation layer in a direction from the substrate to the encapsulation layer;
    a filling portion filled in the entire through hole;
    wherein a refractive index of the filling portion is greater than a refractive index of at least one film layer in the thin film transistor array layer, and/or
    the refractive index of the filling portion is greater than a refractive index of at least one film layer in the organic light emitting diode array layer, and/or
    the refractive index of the filling portion is greater than a refractive index of at least one film layer in the encapsulation layer.

2. The organic light emitting diode display panel according to claim 1, wherein the refractive index of the filling portion is greater than a maximum refractive index of each film layer in the organic light emitting diode array layer, in the thin film transistor array layer, and in the encapsulation layer.

3. The organic light emitting diode display panel according to claim 1, wherein the refractive index of the filling portion ranges from a value being greater than 1.9 to a value being less than or equal to 5.0.

4. The organic light emitting diode display panel according to claim 1, wherein a longitudinal cross-section of the through hole is an inverted trapezoid.

5. The organic light emitting diode display panel according to claim 1, wherein the filling portion comprises a first filling portion filled in the through hole, and a second filling portion filled between an outer wall of the first filling portion and an inner wall of the through hole,
    a refractive index of the first filling portion is greater than a refractive index of the second filling portion;
    the refractive index of the second filling portion is greater than the refractive index of the at least one film layer in the thin film transistor array layer, and/or the refractive index of the second filling portion is greater than the refractive index of the at least one film layer in the organic light emitting diode array layer, and/or the refractive index of the second filling portion is greater than the refractive index of the at least one film layer in the encapsulation layer.

6. The organic light emitting diode display panel according to claim 5, wherein the refractive index of the second filling portion is greater than the maximum refractive index of each film layer in the organic light emitting diode array layer, in the thin film transistor array layer, and in the encapsulation layer.

7. The organic light emitting diode display panel according to claim 1, wherein the preparation material of the filling portion is selected from a group consisting of at least one of Y2O3, CeO2, TiO2, Al2O3, ZnS, ZrO2, MgO, and ThF4.

8. The organic light emitting diode display panel according to claim 7, wherein the refractive index of the filling portion ranges from 2 to 2.5.

9. The organic light emitting diode display panel according to claim 1, wherein a preparation material of the filling portion comprises organic silicon and a plurality of nanoparticles.

10. The organic light emitting diode display panel according to claim 9, wherein a preparation material of the nanoparticles is selected from a group consisting of at least one of Y2O3, CeO2, TiO2, Al2O3, ZnS, ZrO2, MgO, and ThF4.

11. An electronic device, comprising an organic light emitting diode display panel and an optical sensor, the organic light emitting diode display panel comprising:
  a substrate having a first surface and a second surface opposed to each other;
  a thin film transistor array layer formed on the first surface of the substrate;
  an organic light emitting diode array layer formed on a side of the thin film transistor array layer away from the substrate;
  an encapsulation layer formed on a side of the organic light emitting diode array layer away from the substrate;
  a through hole passing through the thin film transistor array layer, the organic light emitting diode array layer, and the encapsulation layer in a direction which the substrate is directed to the encapsulation layer;
  a filling portion filled in the entire through hole; and
  the optical sensor disposed on a side of the second surface of the substrate and corresponding to the through hole;
  wherein a refractive index of the filling portion is greater than a refractive index of at least one film layer in the thin film transistor array layer, and/or
  the refractive index of the filling portion is greater than a refractive index of at least one film layer in the organic light emitting diode array layer, and/or
  the refractive index of the filling portion is greater than a refractive index of at least one film layer in the encapsulation layer.

12. The electronic device according to claim 11, wherein the refractive index of the filling portion is greater than a maximum refractive index of each film layer in the organic light emitting diode array layer, the in thin film transistor array layer, and in the encapsulation layer.

13. The electronic device according to claim 11, wherein the refractive index of the filling portion ranges from a value being greater than 1.9 to a value being less than or equal to 5.0.

14. The electronic device according to claim 11, wherein a longitudinal cross-section of the through hole is an inverted trapezoid.

15. The electronic device according to claim 11, wherein the filling portion comprises a first filling portion filled in the through hole, and a second filling portion filled between an outer wall of the first filling portion and an inner wall of the through hole,
  a refractive index of the first filling portion is greater than a refractive index of the second filling portion;
  the refractive index of the second filling portion is greater than the refractive index of the at least one film layer in the thin film transistor array layer, and/or
  the refractive index of the second filling portion is greater than the refractive index of the at least one film layer in the organic light emitting diode array layer, and/or
  the refractive index of the second filling portion is greater than the refractive index of the at least one film layer in the encapsulation layer.

16. The electronic device according to claim 15, wherein the refractive index of the second filling portion is greater than the maximum refractive index of each film layer in the organic light emitting diode array layer, in the thin film transistor array layer, and in the encapsulation layer.

17. The electronic device according to claim 11, wherein the preparation material of the filling portion is selected from a group consisting of at least one of Y2O3, CeO2, TiO2, Al2O3, ZnS, ZrO2, MgO, and ThF4.

18. The electronic device according to claim 17, wherein the refractive index of the filling portion ranges from 2 to 2.5.

19. The electronic device according to claim 11, wherein a preparation material of the filling portion comprises organic silicon and a plurality of nanoparticles.

20. The electronic device according to claim 19, wherein a preparation material of the nanoparticles is selected from a group consisting of at least one of Y2O3, CeO2, TiO2, Al2O3, ZnS, ZrO2, MgO, and ThF4.

* * * * *